(12) United States Patent
Hatazawa et al.

(10) Patent No.: US 6,255,811 B1
(45) Date of Patent: Jul. 3, 2001

(54) MAGNETIC DETECTOR WITH A MAGNETORESISTIVE ELEMENT HAVING HYSTERESIS

(75) Inventors: Yasuyoshi Hatazawa; Izuru Shinjo; Wataru Fukui, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 08/906,830

(22) Filed: Aug. 11, 1997

(30) Foreign Application Priority Data

Feb. 26, 1997 (JP) ............................................ 9-042301

(51) Int. Cl.$^7$ .................................................. G01B 7/14
(52) U.S. Cl. ......................... 324/207.21; 324/207.11; 324/207.12; 324/207.2; 324/207.21; 324/207.25; 324/252; 324/225
(58) Field of Search ................... 324/207.11, 207.12, 324/207.2, 207.21, 207.25, 252, 225; 338/32 H, 32 R (56) References Cited

U.S. PATENT DOCUMENTS

| | | | | |
|---|---|---|---|---|
| 4,079,360 | * | 3/1978 | Ookubo et al. | 338/32 R |
| 4,725,776 | * | 2/1988 | Onodera et al. | 324/207.21 |
| 5,477,143 | * | 12/1995 | Wu | 324/207.21 |
| 5,801,529 | * | 9/1998 | Umemoto et al. | 324/207.21 |
| 6,014,023 | * | 1/2000 | Yokotani et al. | 324/207.21 |

FOREIGN PATENT DOCUMENTS

| | | |
|---|---|---|
| 3426 784 | 1/1986 | (DE) . |
| 195 07 304 | 9/1995 | (DE) . |
| 195 80 095 | 2/1996 | (DE) . |
| 60-155917 | 8/1985 | (JP) . |
| 61-83910 | 4/1986 | (JP) . |

OTHER PUBLICATIONS

Gonsalves et al., "Speed/position sensor based upon magnetoresistive effect", European Patent application, pp. 1–10, Mar. 1991.*

* cited by examiner

*Primary Examiner*—Jay Patidar
(74) *Attorney, Agent, or Firm*—Sughrue, Mion, Zinn, Macpeak & Seas, PLLC

(57) ABSTRACT

A magnetic detector to detect a magnetic object's rotation and movement using a magnetoresistive element having hysteresis. The magnetoresistive element is set so as to tilt from the magnetizing direction of a magnet up to a predetermined angle $\theta$ between the rotational magnetic object to be detected and the magnet. The magnetic detector provides a high accuracy signal that corresponds to the distance between the rotational magnetic object to be detected and the magnetoresistive element. The signal obtained is independent of the rotational direction or rotational speed of the magnetic object to be detected or the atmospheric temperature of an apparatus. Moreover, the temperature dependency of the output signal (amplitude) of the magnetoresistive element is decreased.

8 Claims, 12 Drawing Sheets

(AT NORMAL ROTATION)

FIG. 12F (AT REVERSE ROTATION)

ELEMENT HAVING NO HYSTERESIS

FIG. 19 PRIOR ART

ELEMENT HAVING HYSTERESIS

OUTPUT WAVEFORM OF MAGNETORESISTIVE ELEMENT
HAVING NO HYSTERISIS

FIG. 22 PRIOR ART

OUTPUT WAVEFORM OF MAGNETORESISTIVE ELEMENT HAVING HYSTERESIS

FIG. 23 PRIOR ART

TEMPERATURE DEPENDENCY OF OUTPUT OF CONVENTIONAL MAGNETORESISTIVE ELEMENT

MAGNETIC DETECTOR WITH A MAGNETORESISTIVE ELEMENT HAVING HYSTERESIS

BACKGROUND OF THE INVENTION

1. Field of the Invention

The present invention relates to a magnetic detector using a resistor having hysteresis to detect rotation and movement of a magnetic body.

2. Description of the Related Art

Figure 16:
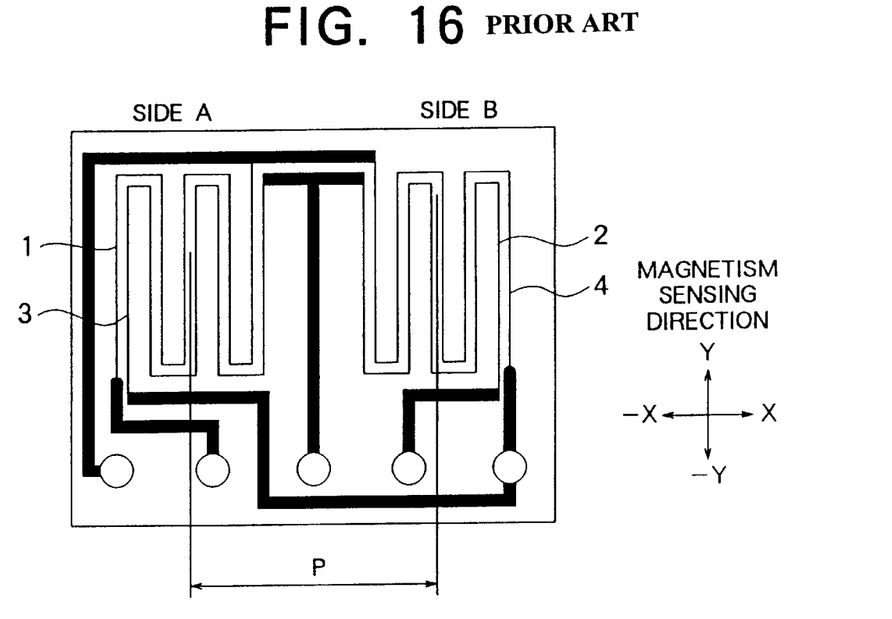
FIG. 16 is a top view of a magnetoresistive element.
Figure 17:
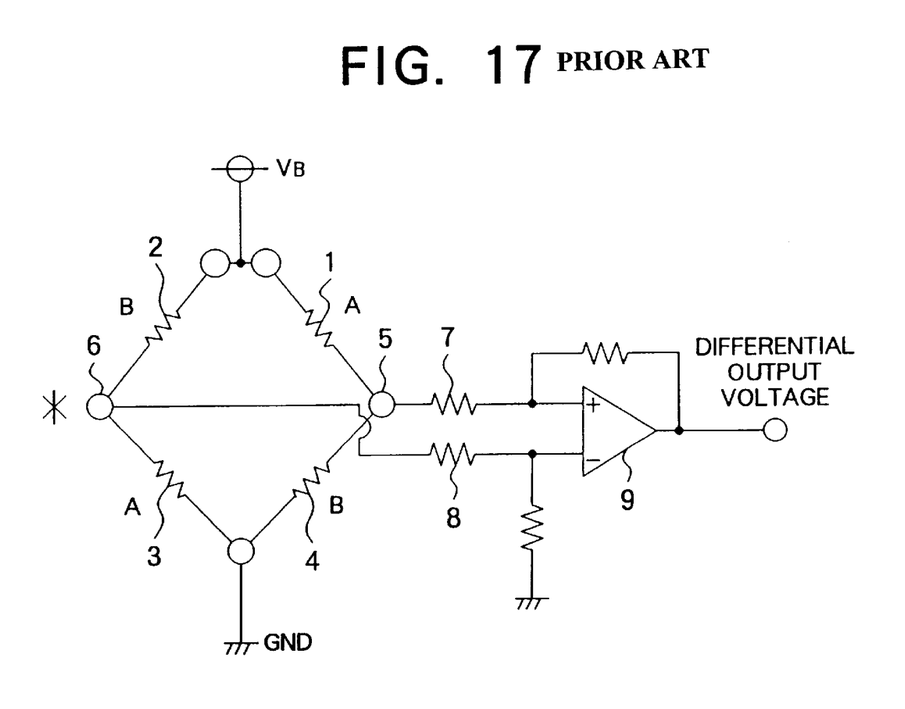
FIG. 17 is an electrical connection diagram of the magnetoresistive element in FIG. 16.

FIG. 16 is a top view showing a magnetoresistive element formed on a silicon substrate to be used for a conventional magnetic detector. FIG. 17 is an electric circuit diagram of the magnetoresistive element in FIG. 16. As shown in FIGS. 16 and 17, a magnetoresistive element M is constituted so as to amplify and generate the voltage difference between middle points (nodes) 5 and 6 by bridge-connecting four same resistors 1 to 4 each other, connecting two faced vertexes to a power supply, Vb and an earth GND respectively, and connecting the middle point (node) 5 between resistors 1 and 4 and the middle point (node) 6 between resistors 2 and 3 to two input terminals of a differential amplifier 9 respectively through resistors 7 and 8.

Figure 18:
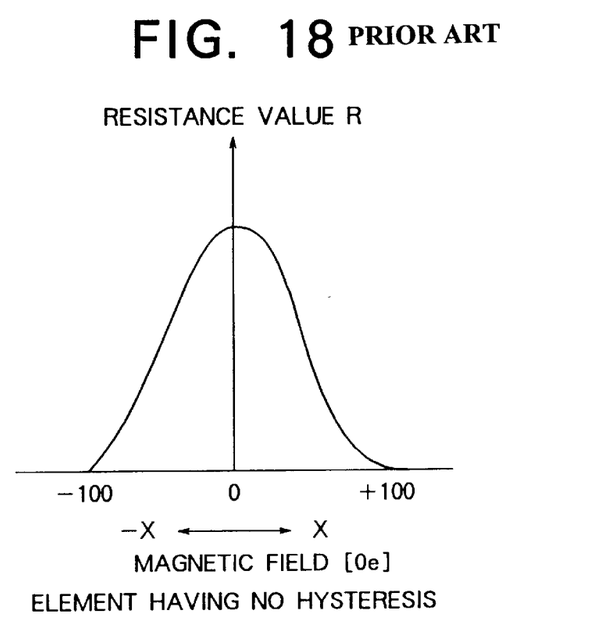
FIG. 18 is an illustration for explaining the operation of a resistor having no hysteresis.
Figure 19:
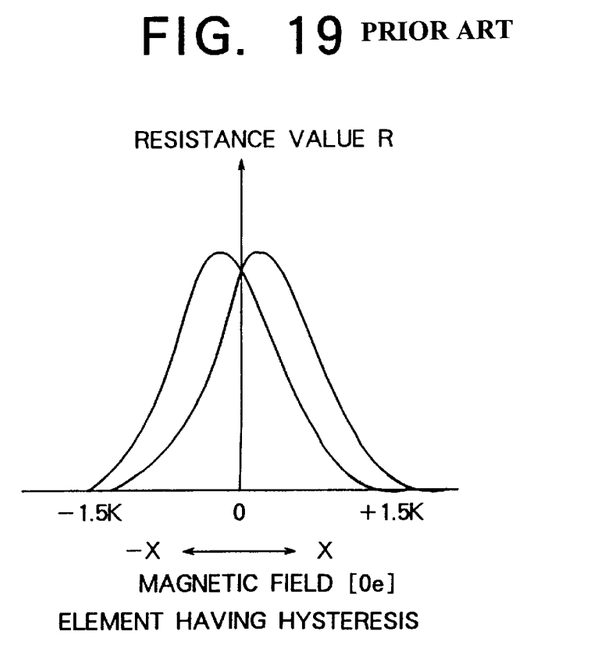
FIG. 19 is an illustration for explaining the operation of a resistor having hysteresis.

The resistance value of each of resistors 1 to 4 of a magnetoresistive element M symmetrically changes by using Y axis or X axis as a symmetry axis correspondingly to X-and Y-directional applied magnetic fields as shown in FIG. 18 and shows the same curve unless the magnetoresistive element M has hysteresis to a magnetic field change. However, in the case of a magnetoresistive element having hysteresis to a magnetic field change, the resistance value changes depending on the magnetic-field applied direction as shown in FIG. 19.

Figure 20:
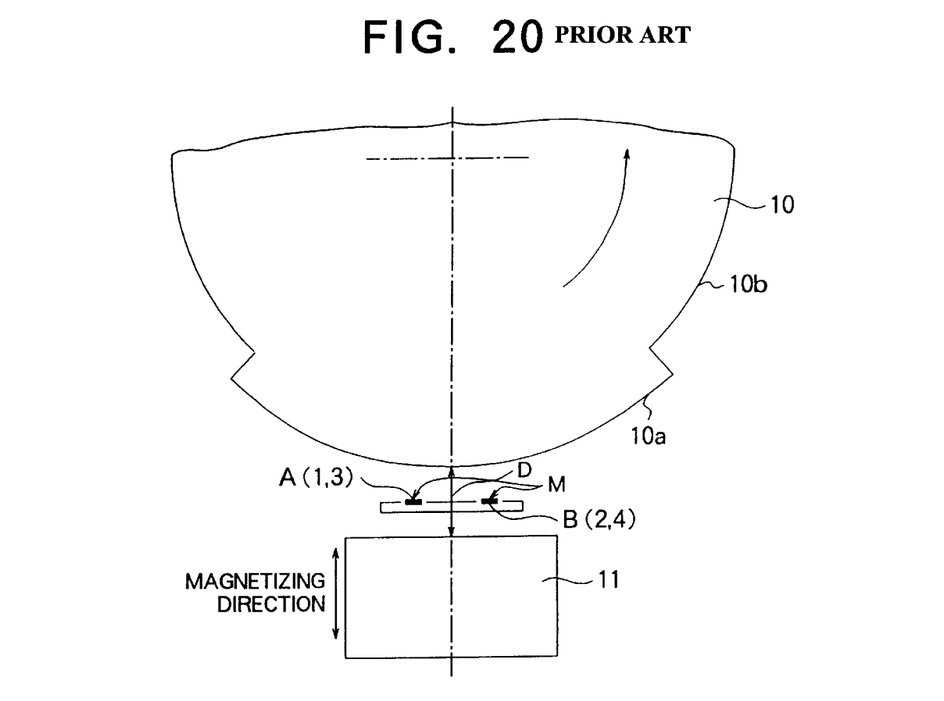
FIG. 20 is a schematic side view showing the arrangement of a conventional magnetic detector.

The magnetic circuit of a conventional magnetic detector using the above magnetoresistive element generally comprises the magnetoresistive element M, magnetic object to be detected 10, and magnet 11 as shown in FIG. 20. In this case, it is assumed that a conventional magnetic detector detects the irregularity of a rotator serving as the magnetic object to be detected 10. That is, the magnetic object to be detected 10 comprises a rotator having a concave 10a and a convex 10b at the outer periphery and the magnet 11 is set so as to face the concave 10a and convex 10b at the outer periphery of the rotator 10. A magnetoresistive element M is set between the rotator 10 and the magnet 11.

Figure 21:
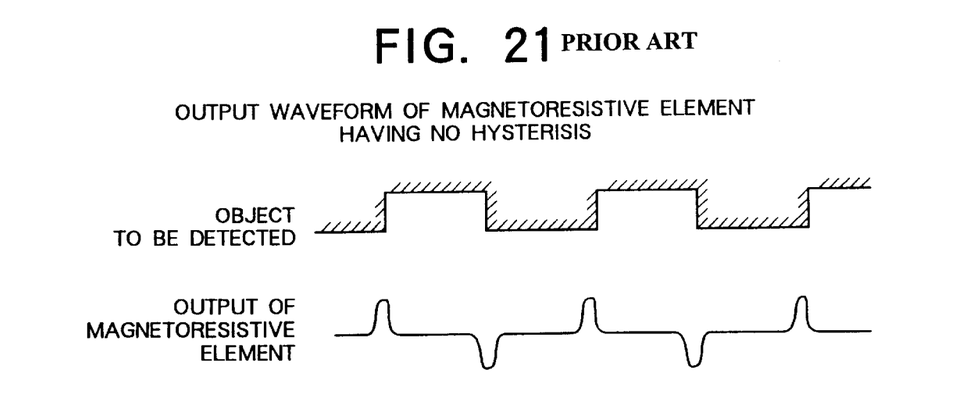
FIG. 21 is an illustration showing an output waveform of a magnetoresistive element having no hysteresis to the irregular portion of an object to be detected.

When the rotator 10 rotates, the magnetic flux density passing through the magnetoresistive element M changes nearby the boundary between the convex 10a and concave 10b, that is, the edge of the convex 10a if the convex 10a of the rotator 10 approaches the magnet 11 and the resistance values of the resistors 1 and 3 at the side A of the magnetoresistive element M increase and the resistance values of the resistors 2 and 4 at the side B of the magnetoresistive element M increase. Therefore, the differential output waveform of a magnetoresistive element M having no hysteresis becomes the waveform shown in FIG. 21 and waveforms corresponding to the concave 10a and convex 10b become same. Therefore, there is a problem that it is impossible to detect the concave and convex 10a and 10b of the rotator 10.

Figure 22:
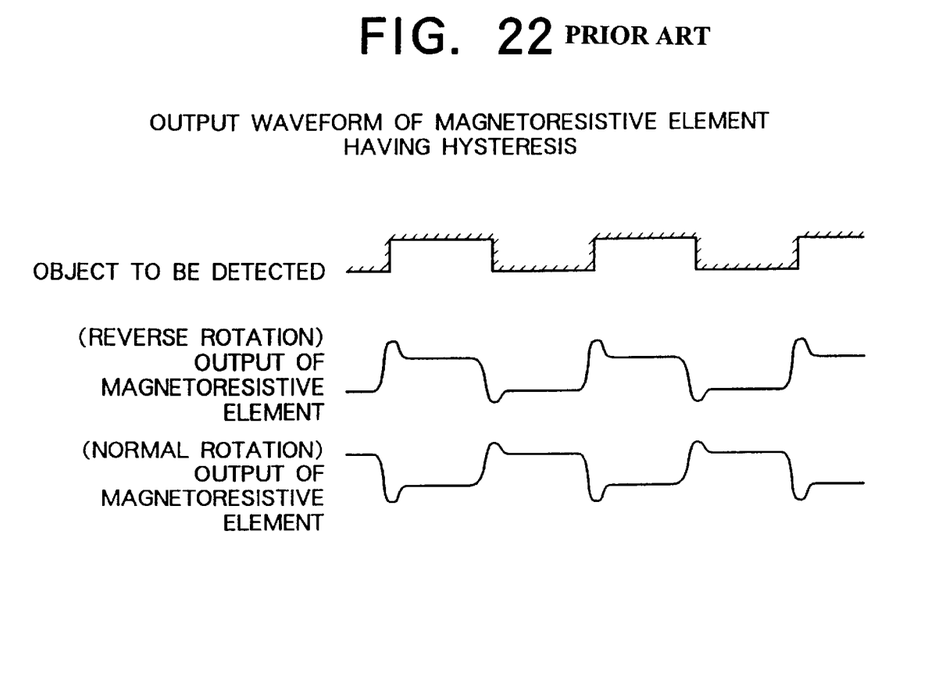
FIG. 22 is an illustration showing output waveforms of a conventional magnetoresistive element having hysteresis to the irregular portion of an object to be detected.

Moreover, a magnetoresistive element M having hysteresis generates a signal corresponding to the size (distance) D of a gap between the rotator 10 and the magnetoresistive element M while the element M rotates in a constant direction. However, if the rotational direction of the rotator 10 is reversed, there is a problem that a signal level is inverted as shown in FIG. 22.

Figure 23:
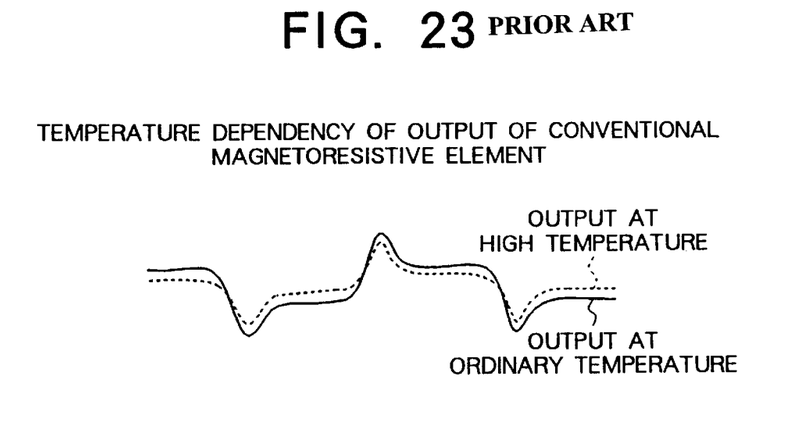
FIG. 23 is an illustration showing the output temperature dependency of a magnetoresistive element.

Furthermore, in the case of the above conventional magnetic circuit, the resistance change value of a magnetoresistive element M decreases at a high temperature. Therefore, as shown in FIG. 23, there is a problem that a signal obtained through rotation of the rotator 10 serving as an object to be detected and the signal accuracy has temperature dependency.

Therefore, to solve the problems of the above conventional example, it is an object of the present invention to provide a magnetic detector capable of obtaining a signal corresponding to the size of the gap between a magnetic object to be detected and a resistor without depending on the moving direction or moving speed of a magnetic object to be detected.

It is another object of the present invention to provide a magnetic detector capable of decreasing the temperature dependency of an output signal (amplitude) of a magnetoresistive element.

SUMMARY OF THE INVENTION

A magnetic detector of the present invention comprises a magnet set nearby a rotatable magnetic object to be detected and a magnetoresistive element having hysteresis and set between the magnetic object to be detected and the magnet so as to tilt from the magnetizing direction of the magnet up to a predetermined angle.

According to the above structure, the magnetic detector can generate a signal corresponding to the distance between the magnetic object to be detected and the magnetoresistive element at a high accuracy independently of the moving direction or moving speed of the magnetic object to be detected.

According to one aspect of the present invention, the magnetic detector is provided with at least a pair of resistors having hysteresis and arranged separately from each other in the rotational direction of the magnetic object to be detected.

According to another aspect of the present invention, the magnet is set so that its magnetizing direction becomes parallel with a line passing through the rotational center of the magnetic object to be detected and the center of at least said two resistors and at least said two resistors are arranged so as to tilt from the line in the rotational direction of the magnetic object to be detected.

According to still another aspect of the present invention, the magnet is set so that its magnetizing direction tilts from the line passing through the rotational center of the magnetic object to be detected and the center of at least said two resistors in the rotational direction of the magnetic object to be detected and at least said two resistors are arranged perpendicularly to the line.

According to still another aspect of the present invention, the temperature dependency of the output amplitude of the magnetoresistive element is decreased by changing the tilt angle of the magnetoresistive element.

According to still another aspect of the present invention, the temperature dependency of the output amplitude of at least said two resistors is decreased by changing the interval between the resistors in the rotational direction of the magnetic object to be detected.

According to still another aspect of the present invention, the temperature dependency of the output amplitude of said two resistors by changing the tilt angle of the magnetoresistive element and moreover changing the interval between said two resistors in the rotational direction of the magnetic object to be detected.

According to a preferred aspect of the present invention, the tilt angle of the magnetoresistive element ranges between 10° and 40°.

According to another preferred aspect of the present invention, the tilt angle of the magnetoresistive element ranges between 20° and 25°.

DESCRIPTION OF THE PREFERRED EMBODIMENTS

The preferred embodiments of the present invention are described below by referring to the accompanying drawings.

Embodiment 1

Figure 1:
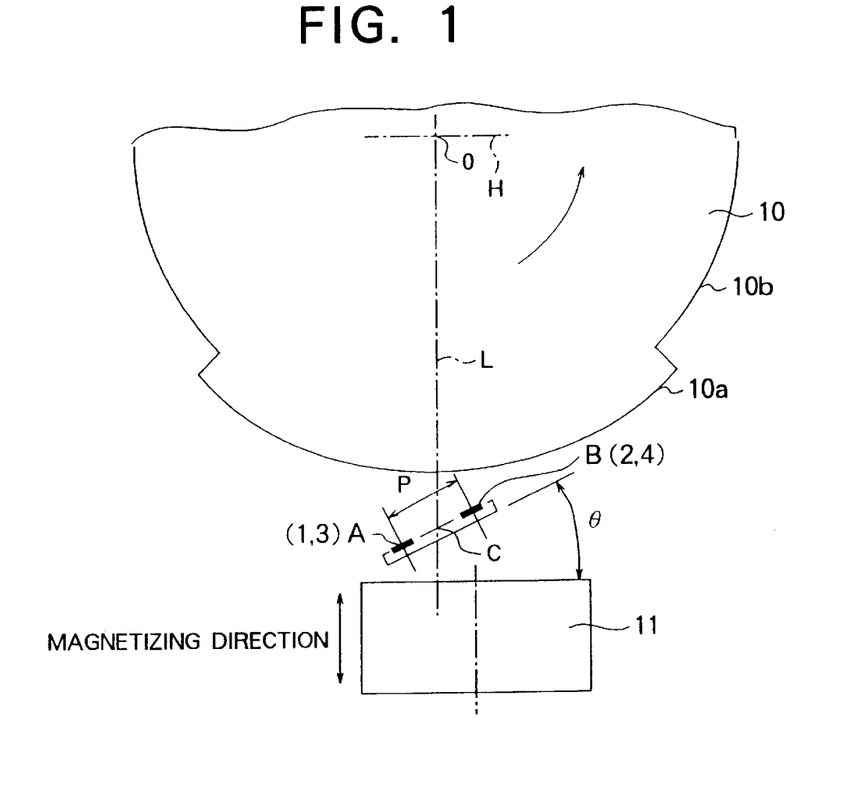
FIG. 1 is a schematic side view showing the magnetic detector of embodiment 1 of the present invention.

FIG. 1 is a schematic top view showing the magnetic detector of embodiment 1 of the present invention. In the case of the embodiment 1, as shown in FIG. 1, the magnet 11 made of a permanent magnet or the like is set separately from the outer periphery of the rotator 10 made of a magnetic body serving as a magnetic object to be detected in the radius direction of the rotator 10 and a magnetoresistive element M having hysteresis is set between the outer periphery of the rotator 10 and the magnet 11. The magnetoresistive element M has the same structure as the conventional example shown in FIG. 16. In the case of this embodiment, the magnet 11 is set so that the magnetizing direction of the magnet 11 becomes parallel with a line L passing through the rotational center O of the rotator 10 and the center (bisectional point) C of the A-side resistors 1 and 3 and the B-side resistors 2 and 4 of the magnetoresistive element M and the magnetoresistive element M is set so that the surface on which the resistors 1 and 3 and the resistors 2 and 4 are arranged tilts from a line H perpendicular to the line L by a predetermined angle θ.

Figure 2:
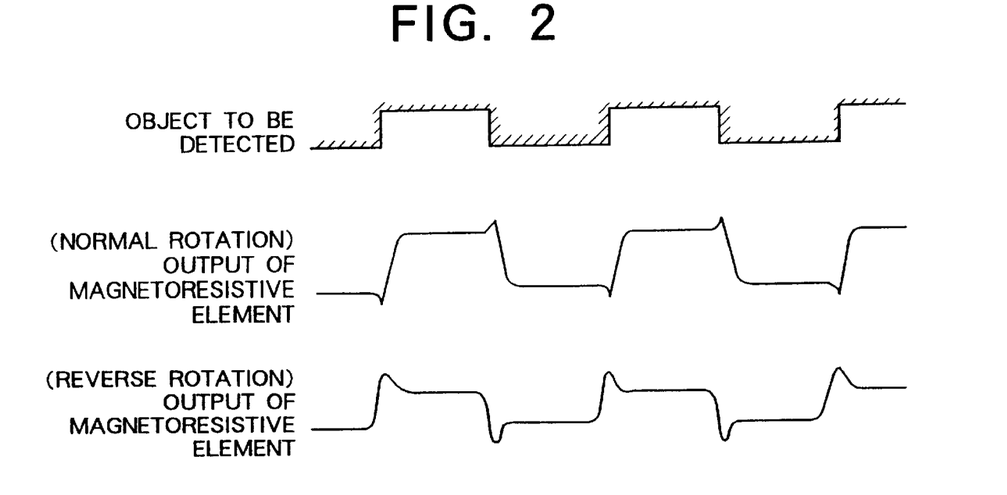
FIG. 2 is an illustration showing output waveforms of the magnetic detector of the embodiment 1 at normal and reverse rotations of an object.

The above arrangement produces the relation between the shape of the magnetic object to be detected and the output waveform of the magnetoresistive element M shown in FIG. 2. By waveform-shaping the output waveform at a predetermined comparison level, it is possible to obtain a signal corresponding to the size of the gap (minimum distance between the outer periphery of the magnetic object to be detected 10 and the intermediate point C between A- and B-side resistors) between the magnetic object to be detected 10 and the magnetoresistive element M without depending on the moving direction or moving speed of the magnetic object to be detected 10.

In this case, the relation among the arrangement of rotator 10, the magnet 11, and magnetoresistive element M on one hand and the output waveform of the magnetoresistive element M on the other is described below by referring to FIGS. 3 to 10.

Figure 3:
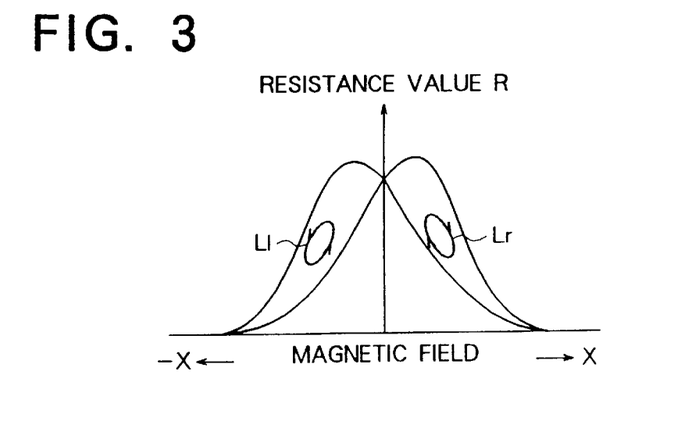
FIG. 3 is an illustration showing operations of a magnetoresistive element having hysteresis and operating-point loops.

First, when the magnetoresistive element M is set perpendicularly to the magnetizing direction of the magnet 11 (when the element M does not tilt) like the case of the conventional example in FIG. 18, the resistance value R of each of the resistors 1 to 4 having hysteresis changes correspondingly to the change of a magnetic field as shown in FIG. 3. In FIGS. 3 to 10, the left loop Ll shows the operating points of the A-side resistors 1 and 3 and the right loop Lr shows the operating points of the B-side resistors 2 and 4.

Figure 4:
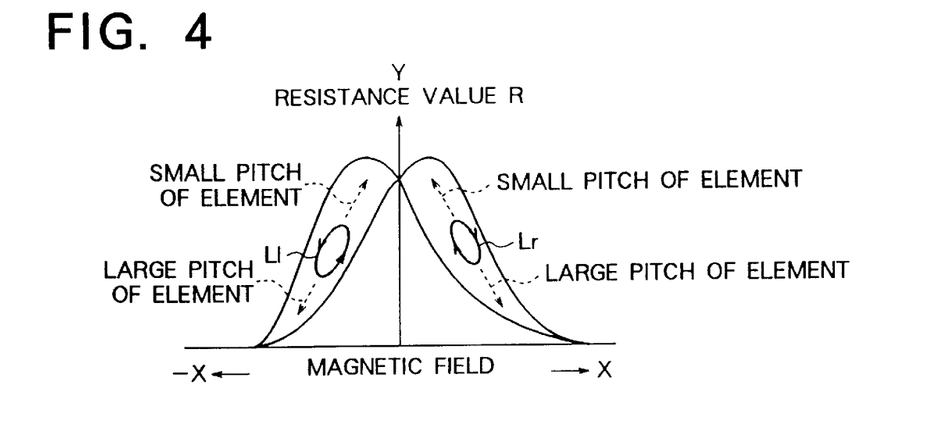
FIG. 4 is an illustration showing the moving states of operating-point loops due to the change of the element pitch of a magnetoresistive element having hysteresis.

The operating point of each of the resistors 1 to 4 moves in accordance with the pitch between the A-side resistors 1 and 3 and the B-side resistors 2 and 4 (interval between the middle between the outermost and innermost portions of the A-side resistors 1 and 3 on one hand and the middle between the outermost and innermost portions of the B-side resistors 2 and 4 on the other) P (see FIG. 16), and the position and shape of the magnet 11 as shown in FIG. 4. That is, the operating point of each element moves upward and inward (diagonally upward) as the pitch P between elements decreases and moves downward and outward (diagonally downward) as the pitch P increases.

Figure 5:
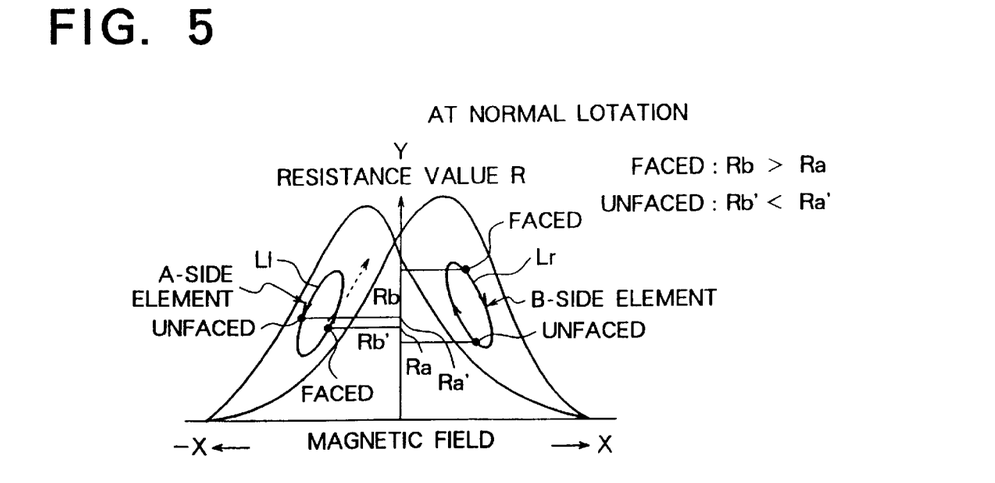
FIG. 5 is an illustration showing the operating points of A- and B-side resistors of a magnetoresistive element having hysteresis at normal rotation of an object to be detected.
Figure 6:
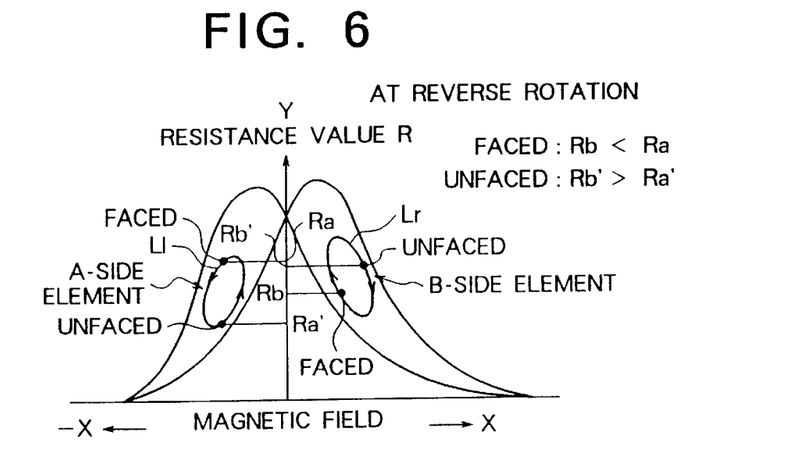
FIG. 6 is an illustration showing the operating points of A- and B-side resistors of a magnetoresistive element having hysteresis at reverse rotation of an object to be detected.
Figure 7:
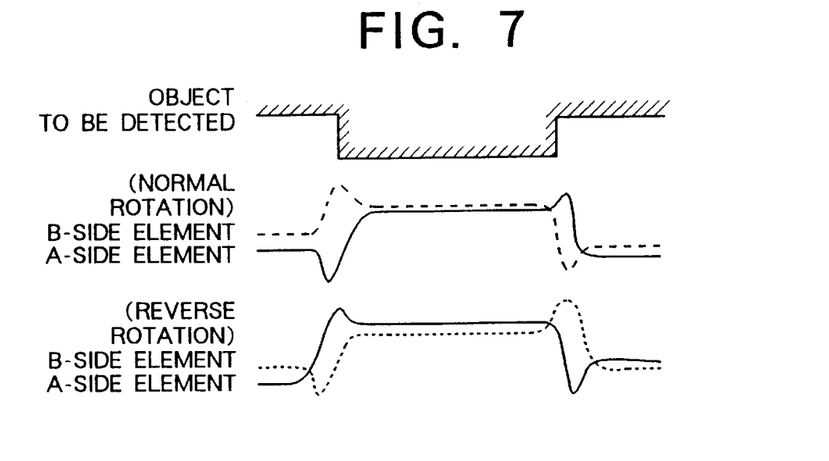
FIG. 7 is an illustration showing output waveforms of a magnetoresistive element having hysteresis at normal and reverse rotations of an object to be detected.

Moreover, in FIG. 20, normal rotation of the rotator 10 produces the element resistance shown in FIG. 5 when each resistor faces the convex 10a and the concave 10b (when each resistor does not face the convex 10a) and reverse rotation of the rotator 10 produces the element resistance shown in FIG. 6. That is, as shown in FIG. 5, in the case of normal rotation of the rotator 10, the operating points of the A-side elements 1 and 3 are present at the inside and outside of the major axis of the elliptic loop L1 respectively when the elements 1 and 3 face and do not face the convex but the operating points of the B-side elements 2 and 4 are present at the outside and inside of the major axis of the elliptic loop Lr respectively when the elements 2 and 4 face and do not face the convex. Moreover, as shown in FIG. 6, in the case of reverse rotation of the rotator 10, the operating points of the A-side elements 1 and 3 are present at the outside and inside of the major axis of the elliptic loop L1 respectively when the elements face and do not face the convex but the operating points of the B-side elements 2 and 4 are present at the inside and outside of the major axis of the elliptic loop Lr respectively when the elements face and do not face the convex. Therefore, the resistance value R of each of the A-side resistors 1 and 3 and the B-side resistors 2 and 4 at normal and reverse rotations changes as shown in FIG. 7 in accordance with the relation between the irregular portions 10a and 10b on the surface of the rotator 10. In FIG. 7, a continuous line shows the resistance change of an A-side resistor and a broken line shows the resistance change of a B-side resistor. Thus, because the magnitude relation between Ra and Rb and that between Ra' and Rb' in FIGS. 5 and 6 are reversed at normal and reverse rotations of the rotator 10, the output of a magnetoresistive element M comprising a bridge circuit is reversed at normal and reverse rotations.

Then, a case of tilting a magnetoresistive element M from the magnetizing direction is described below.

Figure 8:
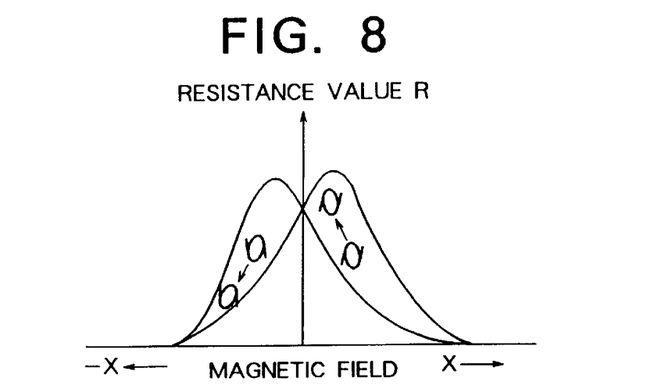
FIG. 8 is an illustration showing the moving state of an operating point due to the change of the tilt angle of a magnetoresistive element having hysteresis.
Figure 9:
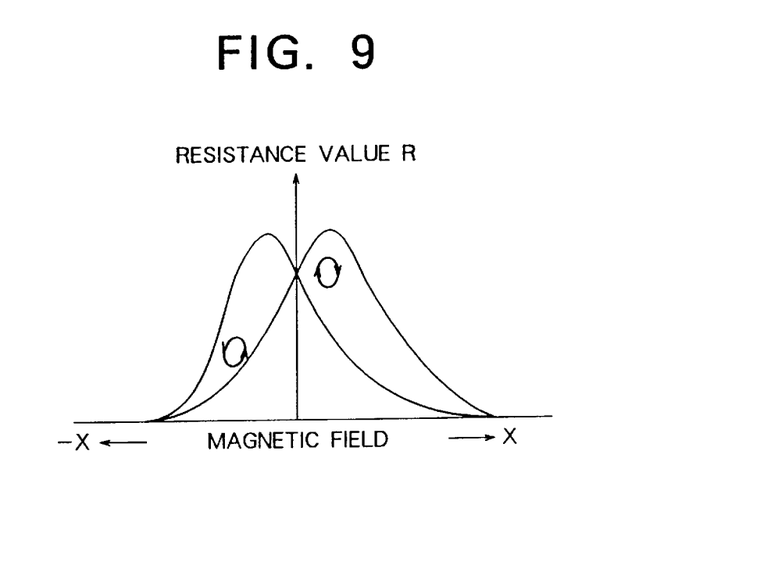
FIG. 9 is an illustration showing the positions of operating-point loops when a magnetoresistive element having hysteresis tilts by a predetermined angle.
Figure 10:
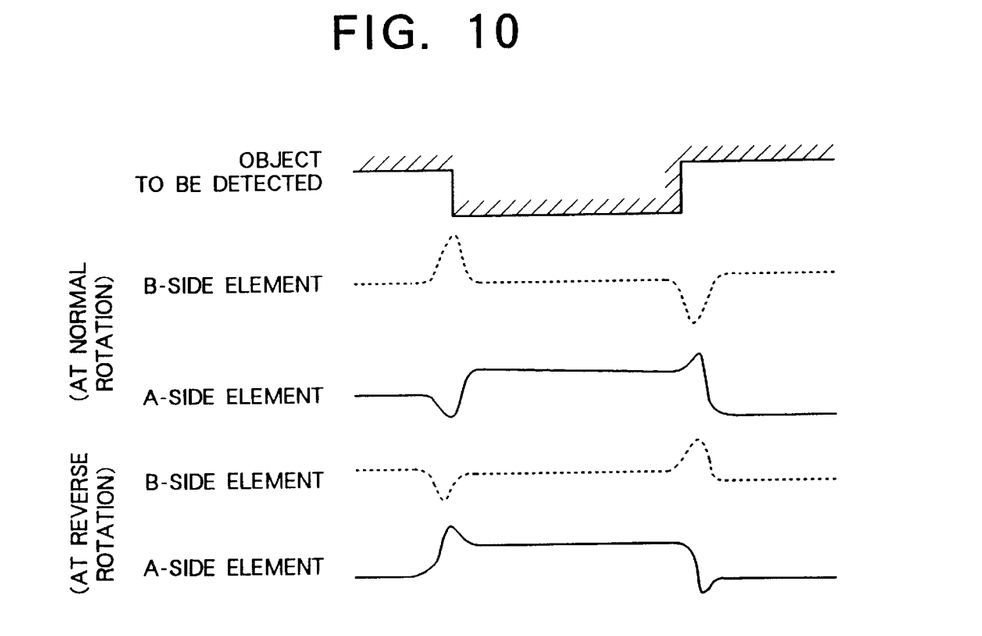
FIG. 10 is an illustration showing output waveforms of a magnetoresistive element having hysteresis at normal and reverse rotations when the magnetoresistive element tilts by a predetermined angle.
Figure 11:
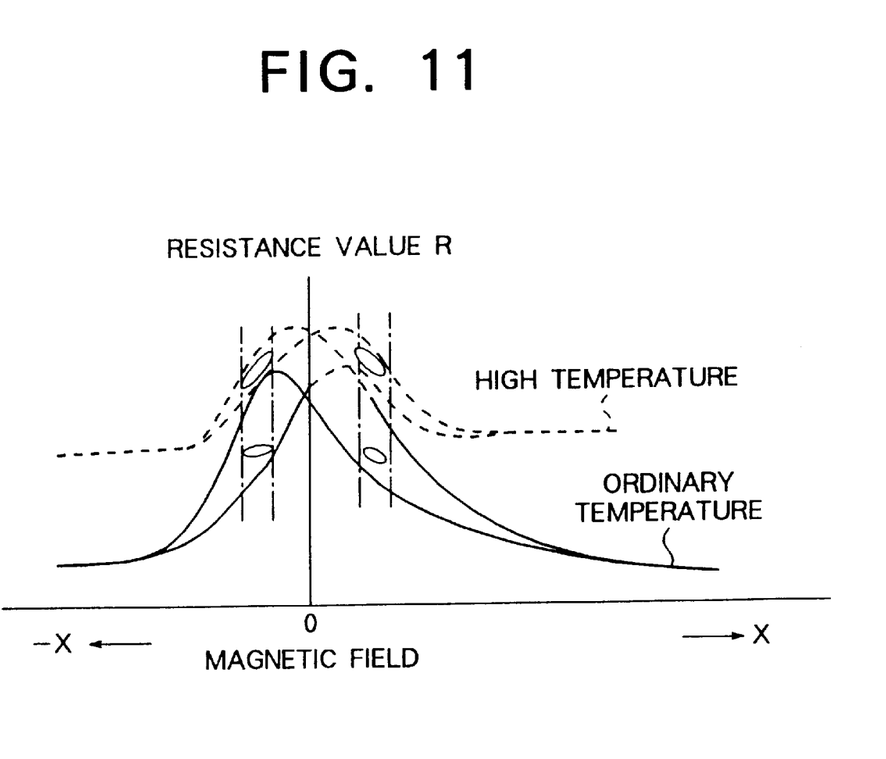
FIG. 11 is an illustration showing the fluctuation in resistance values (resistance values at ordinary temperature and high temperature) of a magnetoresistive element having hysteresis due to temperature change and the moving states of operating-point loops.
Figure 12A:
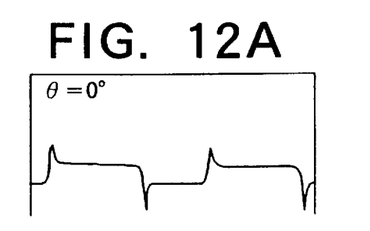
FIGS. 12A to 12K are illustrations showing output waveforms when changing the tilt angle of a magnetoresistive element from 0° to 50° every 5° at reverse rotation of an object to be detected.
Figure 12B:
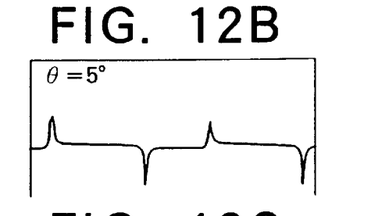
Figure 12C:
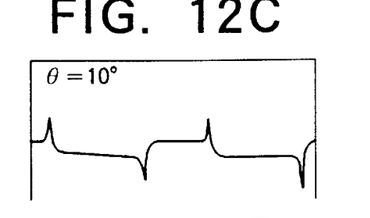
Figure 12D:
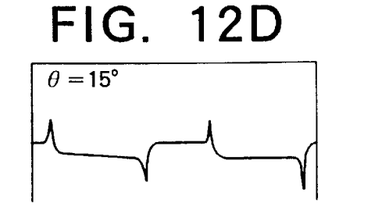
Figure 12E:
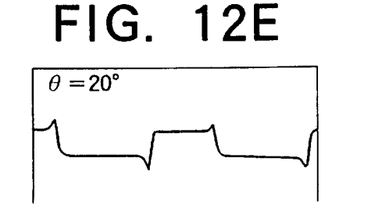
Figure 12F:
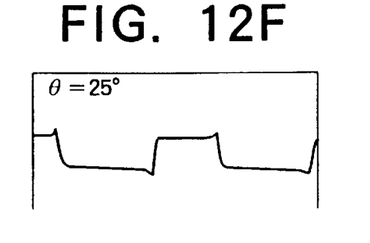
Figure 12G:
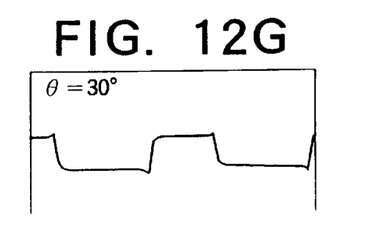
Figure 12H:
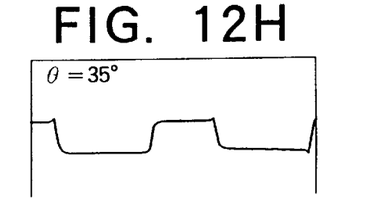
Figure 12I:
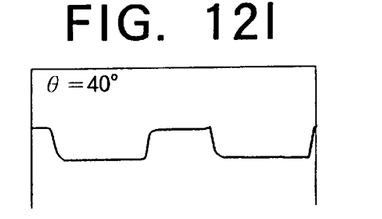
Figure 12J:
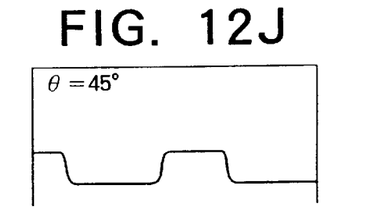
Figure 12K:
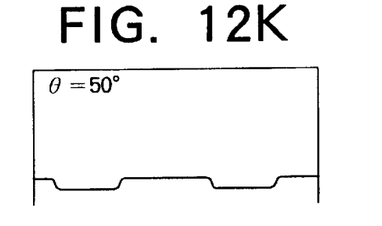
Figure 13A:
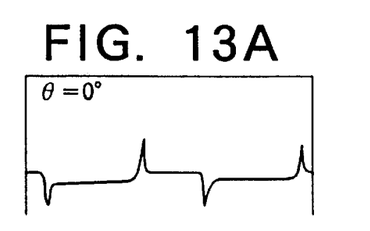
FIGS. 13A to 13K are illustrations showing output waveforms when changing the tilt angle of a magnetoresistive element from 0° to 50° every 5° at reverse rotation of an object to be detected.
Figure 13B:
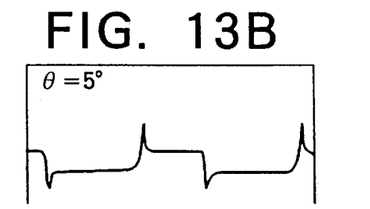
Figure 13C:
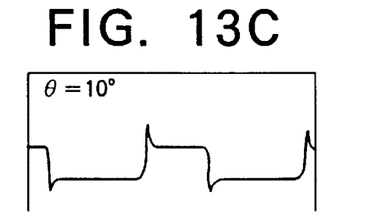
Figure 13D:
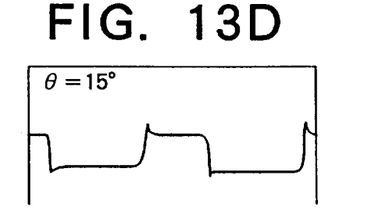
Figure 13E:
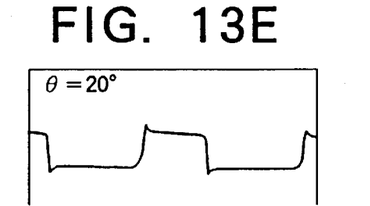
Figure 13F:
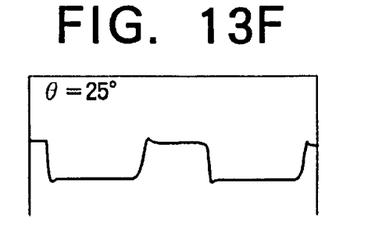
Figure 13G:
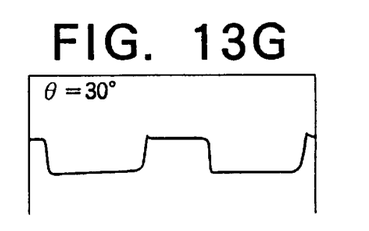
Figure 13H:
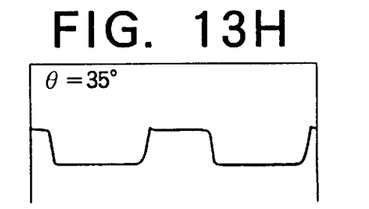
Figure 13I:
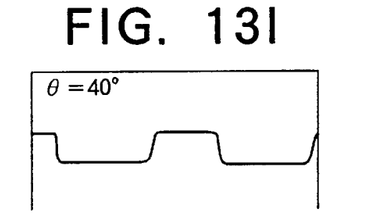
Figure 13J:
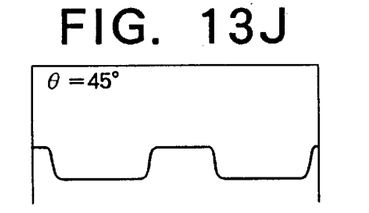
Figure 13K:
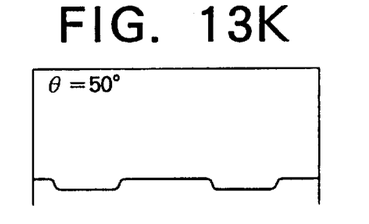

When tilting the magnetoresistive element M as shown in FIG. 1, the operating point of each of the A-side resistors 1 and 3 and B-side resistors 2 and 4 moves as shown in FIGS. 8 and 9 and the resistance R of each of them changes as shown in FIG. 10. In this case, the magnitude relation between Ra and Rb and that between Ra' and Rb' do not change independently of normal and reverse rotations. Therefore, a waveform is not reversed for normal and reverse rotations like the case of the above conventional example in which the magnetoresistive element M is not tilted.

Moreover, generally because a magnetoresistive element has a temperature coefficient different for each operating point, the whole resistance change (difference between zero-magnetic-field resistance value and saturated resistance value) at a high temperature. In the case of an actual operating region, however, there is a point where a resistance change rate increases. Therefore, it is possible to negate the temperature coefficient and decrease the temperature dependency of an element output amplitude by changing the tilt angle θ of a magnetoresistive element M or the pitch P between elements and moving and adjusting an element operating point. That is, it is possible to improve a signal accuracy by adjusting the temperature dependency of an element output and canceling the temperature characteristic of a magnet or signal processing circuit.

FIGS. 12A to 12K show output waveforms of a magnetoresistive element M to the irregular portions 10a and 10b of the magnetic rotator 10 at its normal rotation when changing the tilt angle θ of a magnetoresistive element M from 0° to 50° every 5°. Similarly, FIGS. 13A to 13K show output waveforms of a magnetoresistive element M to the irregular portions 10a and 10b of the magnetic rotator 10 at its reverse rotation when changing the tilt angle θ of the magnetoresistive element M from 0° to 50° every 5°.

Though not illustrated in detail, as the result of examining output waveforms of a magnetoresistive element M by changing its tilt angle from 0° to 50° every degree through experiments, the practical use range of the tilt angle is approx. 10° to 40° and the range from 20° to 25° is particularly preferable.

Figure 14:
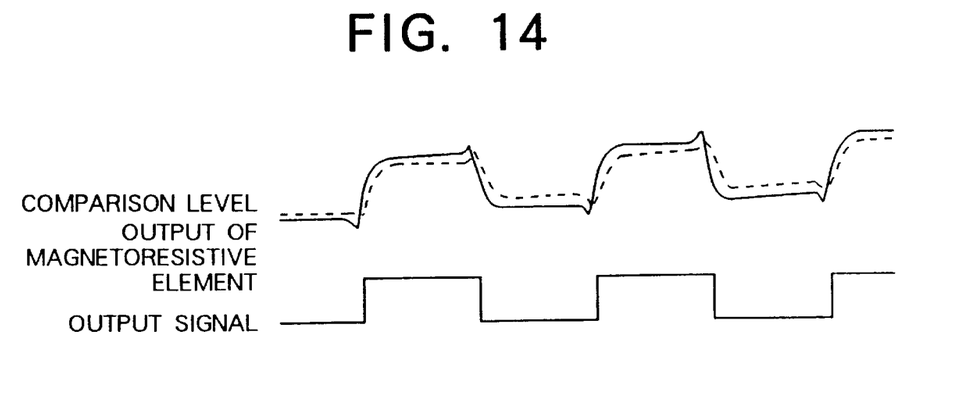
FIG. 14 is a signal waveform diagram showing a case of peak/bottom detection by the present invention.

Moreover, when waveform-shaping the output waveforms of the differential amplifier 9 shown in FIG. 2 through the peak/bottom detection for alternately detecting a peak value and a bottom value of the output waveforms as shown in FIG. 14, they serve as advantageous waveforms in which the gap between a detectable element and a magnetic rotator can be increased.

In the above description, a magnetoresistive element M is tilted so as to make the B-side resistors 2 and 4 approach the magnetic rotator 10. However, it is also possible to make the A-side resistors 1 and 3 approach the magnetic rotator 10.

Embodiment 2

Figure 15:
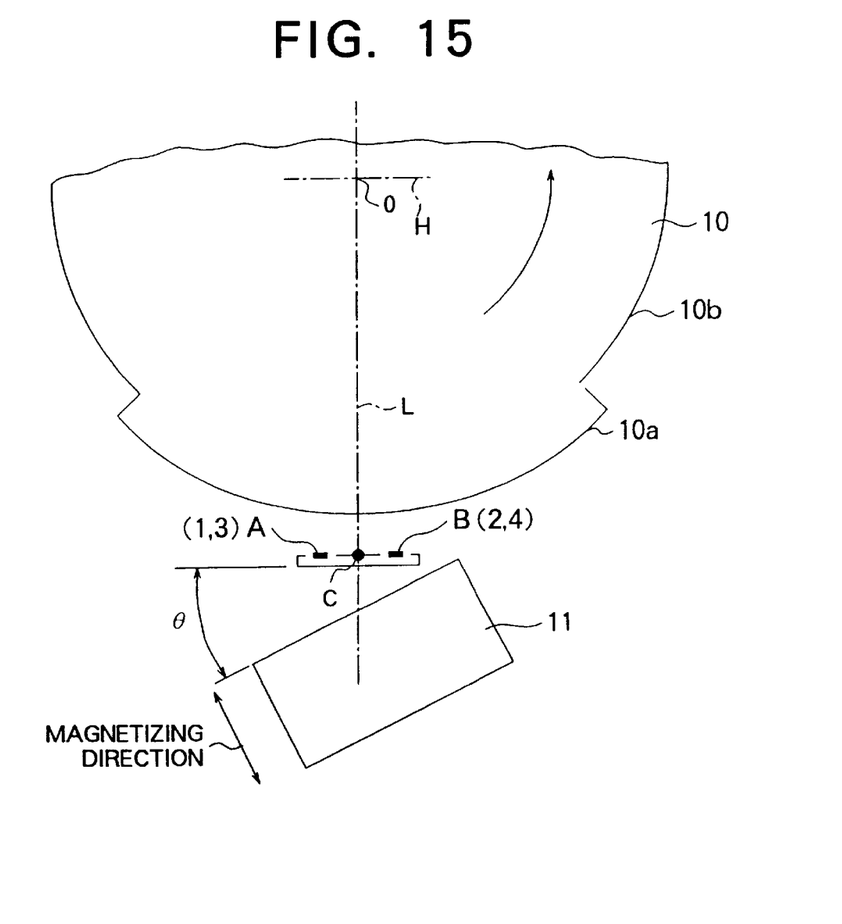
FIG. 15 is a schematic side view showing the arrangement of the magnetic detector of embodiment 2 of the present invention.

FIG. 15 show a case of tilting the magnet 11 up to a certain angle θ from a magnetoresistive element M. In this case, the face of the magnetoresistive element M for which the resistors 1 to 4 are provided is set perpendicularly to the line L passing through the center O of the magnetic rotator 10 and the middle point C between the A- and B-side resistors and the magnet 11 is set so that its magnetizing direction tilts up a certain angle θ from the surface of the magnetoresistive element M, that is, the line H. Also in this case, it is possible to obtain the same advantage as that of the embodiment 1.

As described above, a magnetic detector of the present invention makes it possible to obtain a signal corresponding to the distance between a magnetic object to be detected and a magnetoresistive element without depending on the moving direction or moving speed of the magnetic object to be detected by setting the magnetoresistive element having hysteresis so as to tilt up to a predetermined angle from the magnetizing direction of a magnet.

Moreover, by changing the tilt angle of the magnetoresistive element, it is possible to change the operating point of the magnetoresistive element and reduce the temperature dependency of the output amplitude of the magnetoresistive element.

Furthermore, by changing the interval between at least a pair of resistors constituting a magnetoresistive element in the rotational direction of a magnetic object to be detected, it is possible to change the operating points of the resistors and reduce the temperature dependency of the output amplitude of the resistors.

Furthermore, by changing the tilt angle of a magnetoresistive element and changing the interval between at least a pair of resistors constituting the magnetoresistive element in the rotational direction of a magnetic object to be detected, it is possible to reduce the temperature dependency of the output amplitude of the resistors.

What is claimed is:

1. A magnetic detector comprising:

a magnet disposed proximate a rotatable magnetic object to be detected; and a magnetorresistive element having hysteresis and disposed at a tilt angle from a magnetizing axis of said magnet by a predetermined angle; and wherein the temperature dependency of an output amplitude of said magnetoresistive element is decreased by changing the tilt angle of said magnetoresistive element.

2. A magnetic detector according to claim 1, wherein said magnetoresistive element is provided with at least a pair of resistors having hysteresis and arranged separately from each other in the rotational direction of said magnetic object to be detected.

3. A magnetic detector according to claim 2, wherein said magnet is set so that its magnetizing direction is parallel with a line passing through the rotational center of the magnetic object to be detected and the center of at least said two resistors, and at least said two resistors are arranged so as to tilt from said line in the rotational direction of said magnetic object to be detected.

4. A magnetic detector according to claim 2, wherein said magnet is set so that the magnetizing direction of said magnet tilts from a passing through the rotational center of said magnetic object to be detected and the center of at least said two resistors in the rotational direction of said magnetic object to be detected, and at least said two resistors are arranged perpendicularly to said line.

5. A magnetic detector according to claim 2, wherein the temperature dependency of an output amplitude of at least said two resistors is decreased by changing an interval between said two resistors in the rotational direction of said magnetic object to be detected.

6. A magnetic detector according to claim 1, wherein the tilt angle of said magnetoresistive element ranges between 10° and 40°.

7. A magnetic detector according to claim 1, wherein the tilt angle of said magnetoresistive element ranges between 20° and 25°.

8. A magnetic detector comprising:

a magnet disposed proximate a rotatable magnetic object to be detected; and a magnetorresistive element having hysteresis and disposed at a tilt angle from a magnetizing axis of said magnet by a predetermined angle; and wherein said magnetoresistive element is provided with at least a pair of resistors having hysteresis and arranged separately from each other in the rotational direction of said magnetic object to be directed; and wherein the temperature dependency of an output amplitude of said magnetoresistive element is decreased by changing the tilt angle of said magnetoresistive element and moreover changing an interval between at least said two resistors in the rotational direction of said magnetic object to be detected.

* * * * *